(12) United States Patent
Uzoh

(10) Patent No.: US 9,607,928 B2
(45) Date of Patent: Mar. 28, 2017

(54) METHOD AND STRUCTURES FOR VIA SUBSTRATE REPAIR AND ASSEMBLY

(71) Applicant: Invensas Corporation, San Jose, CA (US)

(72) Inventor: Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/729,729

(22) Filed: Jun. 3, 2015

(65) Prior Publication Data

US 2015/0270193 A1 Sep. 24, 2015

Related U.S. Application Data

(62) Division of application No. 13/711,042, filed on Dec. 11, 2012, now Pat. No. 9,076,785.

(51) Int. Cl.
| | |
|---|---|
| *H01L 21/4763* | (2006.01) |
| *H01L 23/48* | (2006.01) |
| *H01L 23/498* | (2006.01) |
| *H01L 21/768* | (2006.01) |

(52) U.S. Cl.
CPC ...... *H01L 23/481* (2013.01); *H01L 21/76841* (2013.01); *H01L 21/76898* (2013.01); *H01L 23/49827* (2013.01); *H01L 2924/0002* (2013.01)

(58) Field of Classification Search
CPC .... H01L 21/76801–21/76814; H01L 45/1683; H01L 2221/10–2221/1089; H01L 2224/05006–2224/05093; H01L 2224/05546; H01L 21/02063; H01L 21/486; H01L 21/76877–21/76879; H01L 21/76897; H01L 23/481–23/4855; H01L 23/5226; H01L 23/5384

See application file for complete search history.

(56) References Cited

U.S. PATENT DOCUMENTS

| | | | |
|---|---|---|---|
| 6,139,905 A | 10/2000 | Chen et al. | |
| 6,239,021 B1 | 5/2001 | Pramanick et al. | |
| 6,458,696 B1 * | 10/2002 | Gross .................. | H01L 21/2885 205/131 |
| 8,816,505 B2 | 8/2014 | Mohammed et al. | |
| 2007/0018320 A1 | 1/2007 | Tanida et al. | |

(Continued)

*Primary Examiner* — Cuong B Nguyen
(74) *Attorney, Agent, or Firm* — Lerner, David, Littenberg, Krumholz & Mentlik, LLP

(57) ABSTRACT

A component can include a substrate having an opening extending between first and second surfaces thereof, and an electrically conductive via having first and second portions. The first portion can include a first layer structure extending within the opening and at least partially along an inner wall of the opening, and a first principal conductor extending within the opening and at least partially overlying the first layer structure. The first portion can be exposed at the first surface and can have a lower surface located between the first and second surfaces. The second portion can include a second layer structure extending within the opening and at least partially along the lower surface of the first portion, and a second principal conductor extending within the opening and at least partially overlying the second layer structure. The second portion can be exposed at the second surface.

7 Claims, 5 Drawing Sheets

(56) References Cited

U.S. PATENT DOCUMENTS

| | | |
|---|---|---|
| 2008/0246136 A1 | 10/2008 | Haba et al. |
| 2011/0309520 A1 | 12/2011 | Inagaki |
| 2012/0018863 A1 | 1/2012 | Oganesian et al. |
| 2012/0018868 A1 | 1/2012 | Oganesian et al. |
| 2012/0018893 A1 | 1/2012 | Oganesian et al. |
| 2012/0018894 A1 | 1/2012 | Oganesian et al. |
| 2012/0018895 A1 | 1/2012 | Oganesian et al. |
| 2012/0020026 A1 | 1/2012 | Oganesian et al. |
| 2012/0313239 A1 | 12/2012 | Zohni |
| 2012/0313253 A1 | 12/2012 | Nakadaira et al. |
| 2014/0042643 A1 | 2/2014 | Yu et al. |
| 2014/0070423 A1 | 3/2014 | Woychik et al. |

* cited by examiner

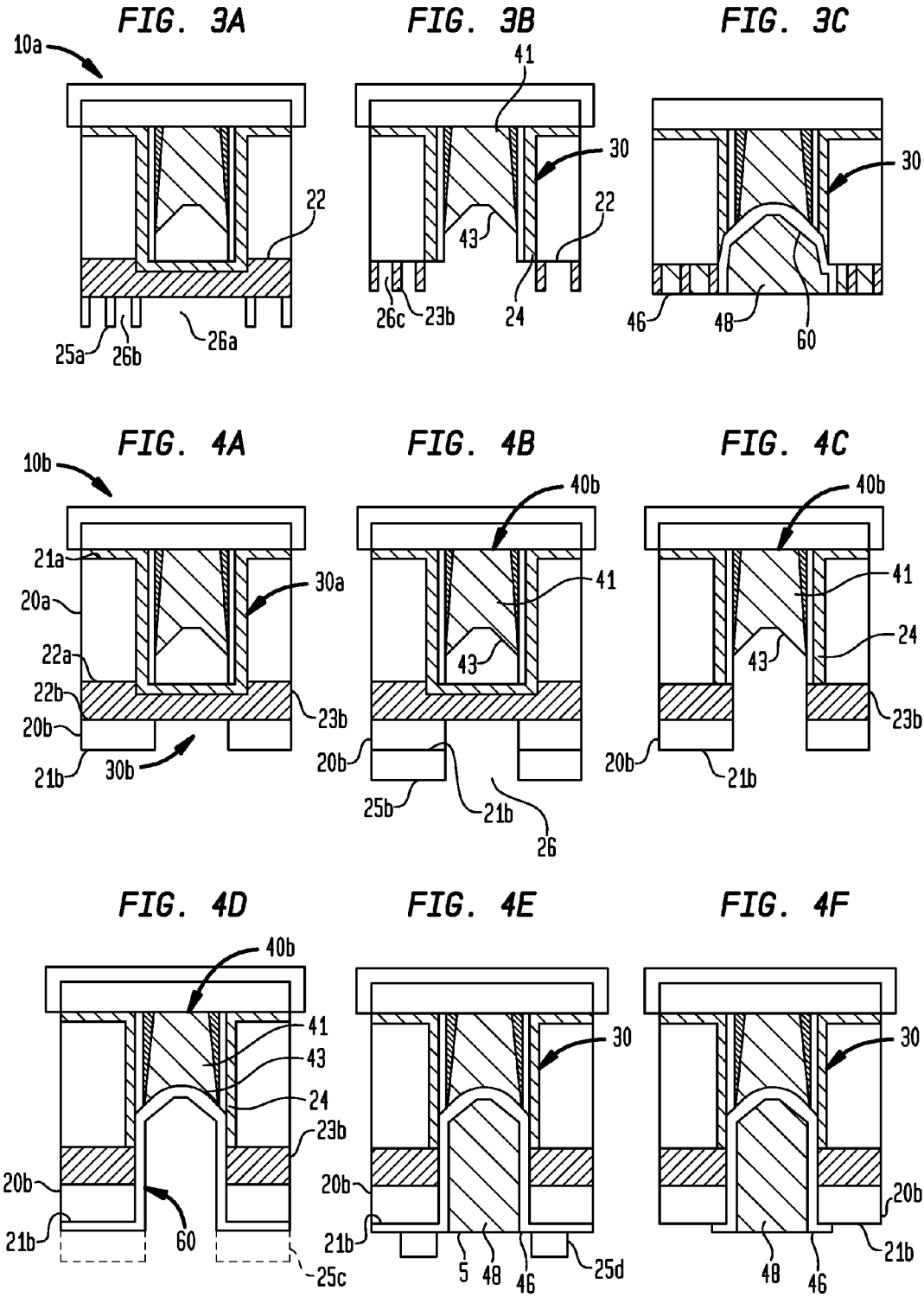

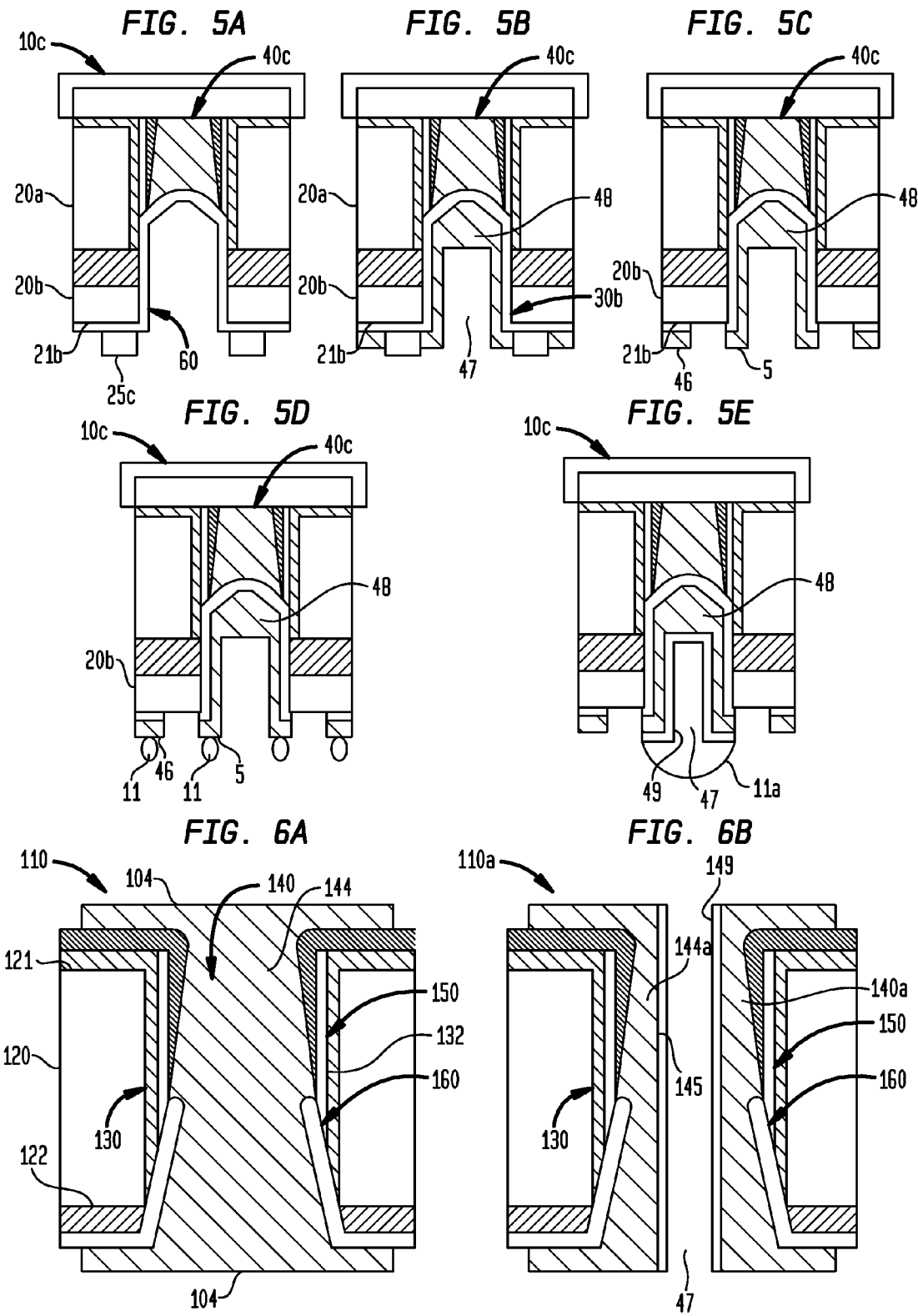

METHOD AND STRUCTURES FOR VIA SUBSTRATE REPAIR AND ASSEMBLY

CROSS-REFERENCE TO RELATED APPLICATIONS

The present application is a divisional of U.S. patent application Ser. No. 13/711,042, filed Dec. 11, 2012, the disclosure of which is incorporated herein by reference.

BACKGROUND OF THE INVENTION

The present invention relates to packaging of microelectronic devices and interposer structures, especially conductive via structures and methods of forming such via structures in semiconductor and interposer packages.

Microelectronic elements generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip. To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 μm thick. The bond pads could include a single layer or multiple layers of metal. The size of the bond pads will vary with the device type but will typically measure tens to hundreds of microns on a side.

Through-silicon vias (TSVs) are used to connect the bond pads with a second face of the semiconductor chip opposite the first face. A conventional via includes a hole penetrating through the semiconductor chip and a conductive material extending through the hole from the first face to the second face. The bond pads may be electrically connected to vias to allow communication between the bond pads and conductive elements on the second face of the semiconductor chip.

Conventional TSV holes may reduce the portion of the first face that can be used to contain the active circuitry. Such a reduction in the available space on the first face that can be used for active circuitry may increase the amount of silicon required to produce each semiconductor chip, thereby potentially increasing the cost of each chip.

Devices having conventional conductive vias may have yield challenges because of defective barrier and/or seed layer conformality to walls of an opening in which the conductive via is deposited. For example, when a conductive via is deposited into an opening in a substrate having a high length to diameter ratio, a barrier and/or seed layer may not fully conform to the walls of the opening. When an electrically conductive via is deposited into the opening, the defective barrier and/or seed layer may prevent the material of the conductive via from being deposited at the bottom of the opening.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via and interposer via formation and interconnection, there is still a need for improvements in order to minimize the size of semiconductor chips and interposer structures, while enhancing electrical interconnection reliability. These attributes of the present invention may be achieved by the construction of the components and the methods of fabricating components as described hereinafter.

BRIEF SUMMARY OF THE INVENTION

In accordance with an aspect of the invention, a component can include a substrate having a first surface, a second surface opposite from the first surface, and an opening extending between the first and second surfaces, the opening having an inner wall extending between the first and second surfaces, a dielectric material being exposed at the inner wall. The component can also include an electrically conductive via having first and second portions.

The first portion can include a first layer structure extending within the opening and at least partially along the inner wall, and a first principal conductor extending within the opening and at least partially overlying the first layer structure within the opening, the first portion being exposed at the first surface and having a lower surface located between the first and second surfaces. The second portion can include a second layer structure extending within the opening and at least partially along the lower surface of the first portion, and a second principal conductor extending within the opening and at least partially overlying the second layer structure within the opening, the second principal conductor extending from the second layer structure towards the second surface, the second portion being exposed at the second surface.

In an exemplary embodiment, the first and second principal conductors can consist essentially of the same material. In one embodiment, the second layer structure can be discontinuous, such that the second principal conductor partially contacts the first portion of the conductive via. In a particular example, the second layer structure can be continuous, such that the second layer structure separates the second principal conductor from the first portion of the conductive via. In a particular embodiment, the material of the first principal conductor can have a different grain size than the material of the second principal conductor.

In one example, the first principal conductor can consist essentially of a first material, and the second principal conductor can consist essentially of a second material different than the first material. In an exemplary embodiment, the second layer structure can be discontinuous, such that the second principal conductor partially contacts the first portion of the conductive via. In one embodiment, the second layer structure can be continuous, such that the second layer structure separates the second principal conductor from the first portion of the conductive via. In a particular example, the second layer structure can include a different material than at least one of the first and second principal conductors.

In a particular embodiment, the second portion of the conductive via can conform to a contour of the lower surface of the first portion of the via, the second portion of the via having a recess extending below the second surface of the substrate. In one example, the component can also include a barrier layer in contact with an exposed surface of the second portion of the via within the recess, at least part of the barrier layer extending below the second surface of the substrate. In an exemplary embodiment, the substrate can consist essentially of the dielectric material. In one embodiment, the substrate can consist essentially of a semiconductor material, and the dielectric material can be a dielectric layer that overlies the semiconductor material within the opening, the dielectric layer defining the inner wall of the opening.

In a particular example, the component can also include an electrically conductive contact in contact with the second portion of the via and at least partially overlying a dielectric layer overlying the second surface, the contact being exposed at the second surface of the substrate for interconnection with a device external to the component. In a particular embodiment, the component can also include an additional substrate assembled with the second surface of the substrate. The second portion of the via can extend through an aperture extending through a thickness of the second substrate. In one example, a system can include a component as described above and one or more other electronic components electrically connected to the component. In an exemplary embodiment, the system can also include a housing, the component and the other electronic components being mounted to the housing.

In accordance with another aspect of the invention, a component can include a substrate having a first surface, a second surface opposite from the first surface, and an opening extending between the first and second surfaces, the opening having an inner wall extending between the first and second surfaces, a dielectric material being exposed at the inner wall. The component can also include an electrically conductive via having first and second layer structures and a principal conductor.

The first layer structure can extend within the opening at least partially along the inner wall, the first layer structure being exposed at the first surface and having a lower edge located between the first and second surfaces. The second layer structure can contact the first layer structure and can extend within the opening at least partially along the inner wall, the second layer structure being exposed at the second surface and having an upper edge located between the first and second surfaces. The principal conductor can at least partially overlie the first layer structure and the second layer structure, the principal conductor being exposed at the first and second surfaces of the substrate.

In one embodiment, the principal conductor can conform to a contour of the first and second layer structures within the opening, the principal conductor defining an aperture extending therethrough between the first and second surfaces of the substrate. In a particular example, the component can also include a barrier layer overlying an exposed surface of the principal conductor within the aperture. In a particular embodiment, the component can also include a dielectric region within the aperture overlying the barrier layer. In one example, a system can include a component as described above and one or more other electronic components electrically connected to the component. In an exemplary embodiment, the system can also include a housing, the component and the other electronic components being mounted to the housing.

In accordance with yet another aspect of the invention, a method of fabricating a component can include forming a first portion of an electrically conductive via extending within an opening in a substrate, the opening extending from a first surface of the substrate towards a second surface opposite from the first surface, the opening having an inner wall extending away from the first surface and a bottom remote from the first surface, at least part of a lower surface of the first portion spaced apart from the bottom of the opening. The method can also include exposing the lower surface of the first portion of the via at the second surface of the substrate. The method can also include forming a second portion of the via in contact with the lower surface of the first portion at a juncture located between the first and second surfaces of the substrate, the second portion being exposed at the second surface.

In a particular embodiment, the first portion of the conductive via can consist essentially of a first material, and the second portion of the conductive via can consist essentially of a second material different than the first material. In one example, the step of forming the first portion of the conductive via can include forming a first layer structure extending within the opening at least partially along the inner wall and forming a first principal conductor at least partially overlying the first layer structure. The lower surface can be a surface of the first principal conductor. In an exemplary embodiment, the first layer structure can be formed extending completely along the inner wall and the bottom of the opening. In one embodiment, the first layer structure can be formed such that at least a part of the bottom of the opening is exposed in a gap within the first layer structure.

In a particular example, the step of forming the first layer structure can include forming a barrier layer extending at least partially along the inner wall and forming a seed layer extending at least partially along the barrier layer. The first principal conductor can be formed at least partially overlying the seed layer. In a particular embodiment, the barrier can be configured to be an adhesion layer. In one example, the step of forming the second portion of the conductive via can include forming a second layer structure in contact with the first portion of the conductive via. The step of forming the second of the conductive via can also include forming a second principal conductor at least partially overlying the second layer structure. At least part of the second principal conductor can contact the second layer structure at a location between the first and second surfaces of the substrate. The second principal conductor can be exposed at the second surface.

In an exemplary embodiment, the second layer structure can be discontinuous, such that the second principal conductor is formed partially in contact with the first portion of the conductive via. In one embodiment, the second layer structure can be continuous, such that the second layer structure separates the first portion of the conductive via from the second principal conductor of the second portion. In a particular example, the step of forming the second layer structure can include forming a barrier layer extending at least partially along the lower surface of the first portion of the conductive via and forming a seed layer extending at least partially along the barrier layer. The second principal conductor can be formed at least partially overlying the seed layer.

In a particular embodiment, the second portion of the via can be formed conforming to a contour of the lower surface of the first portion of the via. The method can also include forming a dielectric material in contact with an exposed surface of the second portion of the via, at least part of the dielectric material extending below the second surface of the substrate. In one example, the first portion of the conductive via can be formed overlying a dielectric material at the inner wall and the bottom of the opening. In an exemplary embodiment, the substrate can consist essentially of the dielectric material, the dielectric material defining the inner wall and the bottom of the opening.

In one embodiment, the substrate can consist essentially of a semiconductor material. The method can also include, before the step of forming the first portion of the conductive via, forming a layer of the dielectric material overlying the substrate material within the opening, the dielectric layer defining the inner wall and the bottom of the opening. In a particular example, the exposing step can include removing a planar portion of the substrate from the second surface, such that a thickness of the substrate between the first and second surfaces is reduced. In a particular embodiment, the method can also include, before the exposing step, forming a layer of dielectric material at least partially overlying the second surface, such that during the exposing step, the lower surface of the first portion of the via is exposed through an aperture extending through the dielectric layer.

In one example, the method can also include forming an electrically conductive contact in contact with the second portion of the via and at least partially overlying the dielectric layer, the contact being exposed at the second surface of the substrate for interconnection with a device external to the component. In an exemplary embodiment, the method can also include forming electrically conductive traces at least partially overlying the dielectric layer, the conductive contact and at least a part of the second portion of the conductive via being formed in a single operation. In one embodiment, the method can also include forming an electrically conductive contact in contact with the first portion of the via and at least partially overlying the first surface of the substrate, the contact being exposed at the first surface of the substrate for interconnection with a device external to the component.

In a particular example, the method can also include, before the step of forming the first portion of the conductive via, forming the opening extending from the first surface of the substrate towards the second surface. In a particular embodiment, the opening can be formed extending through an electrically conductive element at least partially overlying the first surface of the substrate, and at least part of the first portion of the conductive via can be formed overlying a surface of the conductive element.

In accordance with still another aspect of the invention, a method of fabricating a component can include forming a first portion of an electrically conductive via extending within an opening in a first substrate, the opening extending from a first surface of the first substrate towards a second surface of the first substrate opposite from the first surface, the opening having an inner wall extending away from the first surface and a bottom remote from the first surface, at least part of a lower surface of the first portion spaced apart from the bottom of the opening. The method can also include joining a second substrate having first and second opposed surfaces to the first substrate, such that the second surface of the second substrate faces the second surface of the first substrate.

The method can also include exposing the lower surface of the first portion of the via at the first surface of the second substrate. The method can also include forming a second portion of the via in contact with the lower surface of the first portion at a juncture located between the first and second surfaces of the substrate, at least part of the second portion extending through an aperture of the second substrate, the second portion being exposed at the first surface of the second substrate. In one example, the second portion of the conductive via can be formed conforming to a contour of the lower surface of the first portion of the conductive via, and conforming to a contour of material of the second substrate exposed within the aperture.

In accordance with another aspect of the invention, a method of fabricating a component can include forming a first layer structure extending within an opening in a substrate, the opening extending from a first surface of the substrate towards a second surface opposite from the first surface, the opening having an inner wall extending away from the first surface and a bottom remote from the first surface, the first layer structure extending at least partially along the inner wall. The method can also include exposing the opening at the second surface of the substrate by processing applied to the substrate from above the second surface. The method can also include forming a second layer structure in contact with the first layer structure, the second layer structure extending at least partially along the inner wall. The method can also include forming a principal conductor at least partially overlying the first layer structure and the second layer structure, the principal conductor being exposed at the first and second surfaces of the substrate.

In an exemplary embodiment, the principal conductor can be formed conforming to a contour of the first and second layer structures within the opening, the principal conductor defining an aperture extending therethrough between the first and second surfaces of the substrate. In one embodiment, the method can also include forming a barrier layer overlying an exposed surface of the aperture. In a particular example, the method can also include forming a dielectric region within the aperture overlying the barrier layer. In a particular embodiment, the method can also include forming electrically conductive first traces at least partially overlying the first surface of the substrate, the first traces and the principal conductor being formed in a single operation. In one example, the method can also include forming electrically conductive second traces at least partially overlying the second surface of the substrate, the first and second traces and the principal conductor being formed in a single operation.

BRIEF DESCRIPTION OF THE DRAWINGS

FIGS. 3A-3C are side sectional views illustrating stages of fabrication in accordance with an alternative embodiment of the conductive via shown in FIG. 1A.

FIGS. 4A-4F are side sectional views illustrating stages of fabrication in accordance with another alternative embodiment of the conductive via shown in FIG. 1A.

FIGS. 5A-5D are side sectional views illustrating stages of fabrication in accordance with yet another alternative embodiment of the conductive via shown in FIG. 1A.

FIG. 5E is a side sectional view illustrating a component in accordance with an alternative embodiment of the conductive via shown in FIG. 5D.

FIGS. 6A and 6B are side sectional views illustrating components in accordance with alternative embodiments of the conductive via shown in FIG. 1A.

DETAILED DESCRIPTION

Figure 1A:
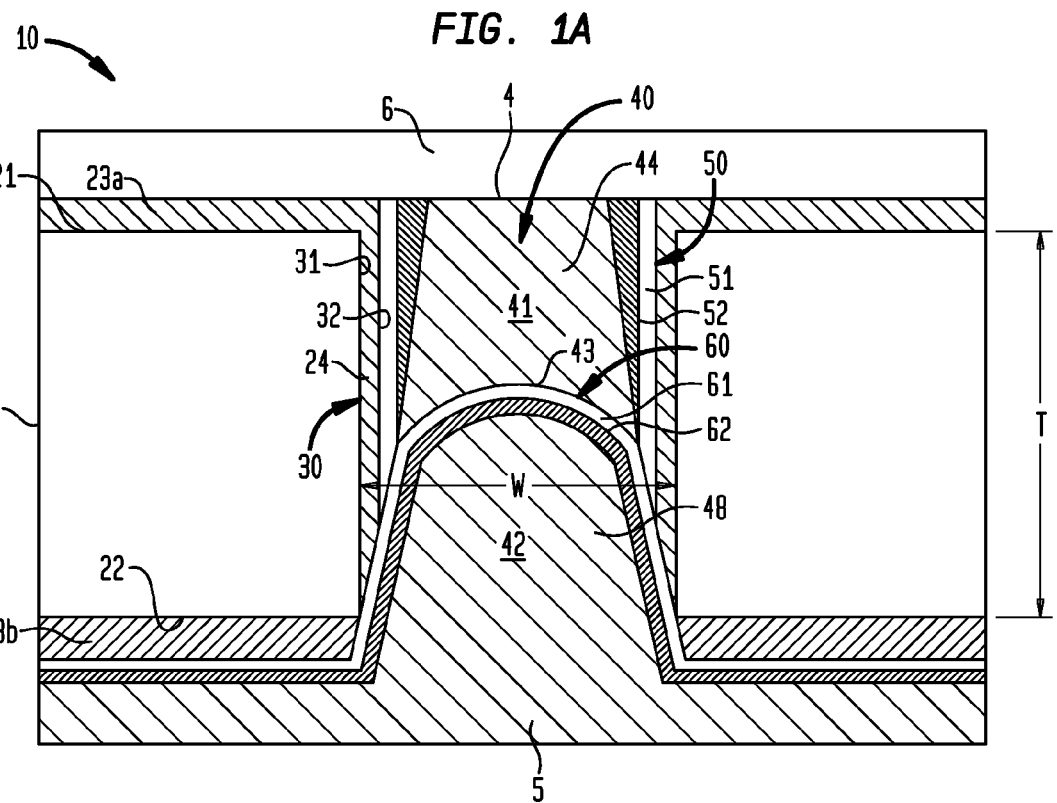
FIG. 1A is a side sectional view illustrating a component in accordance with an embodiment of the invention.

As illustrated in FIG. 1A, a component 10 can include a substrate 20 having a first surface 21 and a second surface 22 opposite therefrom, and a conductive via 40 disposed within an opening 30 extending from the first surface towards the second surface.

In some embodiments, the substrate 20 may be a semiconductor chip, a wafer, or the like. The substrate 20 preferably has a coefficient of thermal expansion ("CTE") less than 10 parts per million per degree Centigrade ("ppm/° C."). In a particular embodiment, the substrate 20 can have a CTE less than 7 ppm/° C. The substrate 20 may consist essentially of an inorganic material such as silicon. The thickness of the substrate 20 between the first surface 21 and the second surface 22 typically is less than 500 µm, and can be significantly smaller, for example, 130 µm, 70 µm or even smaller. In some embodiments, the substrate 20 can be made from a material such as semiconductor material, ceramic, glass, liquid crystal material, a composite material such as glass-epoxy or a fiber-reinforced composite, a laminate structure, or a combination thereof.

In one example, the substrate 20 can include a composite material that has an effective CTE that is tunable during fabrication of the substrate to approximately match the CTE of the metal of the conductive vias that extend therein, such as copper or nickel, as described, for example, in the co-owned and co-pending U.S. patent application Ser. No. 13/613,611, filed Sep. 13, 2012, which is hereby incorporated by reference herein. For example, the substrate can have an effective CTE that is tunable to a value between 10-20 ppm/° C. In a particular embodiment, the substrate 20 can have an effective CTE that is tunable to a value between 15-18 ppm/° C.

In embodiments where the semiconductor element 20 includes a semiconductor substrate, made for example from silicon, one or a plurality of semiconductor devices (e.g., transistors, diodes, etc.) can be disposed in an active device region thereof located at and/or below the first surface 21 and/or the second surface 22.

In FIG. 1A, the directions parallel to the first surface 21 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

As used in this disclosure with reference to a substrate, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate.

The substrate 20 can further include an insulating dielectric layer 23a overlying the first surface 21 and/or an insulating dielectric layer 23b overlying the second surface 22. Such dielectric layers can electrically insulate conductive elements from the substrate 20. These dielectric layers can be referred to as "passivation layers" of the substrate 20. The dielectric layers can each include an inorganic or organic dielectric material or both. One or both of the dielectric layers can include an electrodeposited conformal coating or other dielectric material, for example, a photoimageable polymeric material, for example, a solder mask material.

In the embodiments described herein, a dielectric layer overlying the first surface 21 and/or the second surface (e.g., a dielectric layer 23a or 23b) can have a thickness that is substantially less than a thickness of the substrate 20, such that the substrate can have an effective CTE that is approximately equal to the CTE of the material of the substrate, even if the CTE of the dielectric layer is substantially higher than the CTE of the substrate material. In one example, the substrate 20 can have an effective CTE less than 10 ppm/° C.

The substrate 20 can include one or more openings 30 extending from the first surface 21 through a thickness T of the substrate to the second surface 22. Although only one opening 30 is depicted in FIG. 1A, the substrate 20 typically includes many such openings. The openings 30 can be arranged in any geometric configuration, including for example, an m×n array, the array arranged in a plane parallel to the first surface 21 of the substrate 20, each of m and n being greater than 1.

Each opening 30 includes an inner surface 31 that extends from the first surface 21 through the substrate 20 to the second surface 22 at an angle between 0 and 90 degrees to the horizontal plane defined by the first surface. The inner surface 31 can have a constant slope or a varying slope. For example, the angle or slope of the inner surface 31 relative to the horizontal plane defined by the first surface 21 can decrease in magnitude (i.e., become less positive or less negative) as the inner surface penetrates further towards the second surface 22. In a particular embodiment, each opening 30 can be tapered in a direction from the first surface 21 towards the second surface 22. In some examples, each opening can have any three-dimensional shape, including for example, a frusto-conical shape, a cylinder, a cube, a prism, an elliptic paraboloid, a hyperboloid, or a structure bounded by a curvilinear inner surface, among others. As used herein, when a three-dimensional structure is described as having or being bounded by a curvilinear surface, a cross-section of that surface in a plane that is generally perpendicular to the first and second surfaces of the substrate is a curve having a varying slope (e.g., a second order polynomial).

Each opening 30 can have a high aspect ratio, i.e., the ratio of the thickness T of the substrate 20 to the maximum width W of the opening between opposite sides of the inner surface 31 in a direction perpendicular to the first surface 21 of the substrate. For example, the aspect ratio may be above 10, such as 10-20 or 15-20, for example. In some embodiments, the aspect ratio may be above 20, such as 20-30, for example.

In particular embodiments, the opening 30 and any of the other openings described herein can have various shapes, as described for example in United States Patent Application Publication Nos. 2012/0018863 and 2012/0018868, which are hereby incorporated by reference herein, and such openings can be formed using exemplary processes as described in the aforementioned applications.

The component 10 can also include an insulating dielectric layer 24 overlying the inner surface 31 of the opening 30 and extending from the first surface 21 towards the second surface 22, such that the conductive via 40 extends within the insulating dielectric layer. Such an insulating dielectric layer 24 can separate and electrically insulate the conductive via 40 from the material of the substrate 20, at least within the opening 30. The insulating dielectric layer and the insulating dielectric layer 23a can be formed together as a single insulating dielectric layer, or they can be formed separately as individual insulating dielectric layers.

In one example, such an insulating dielectric layer 24 can conformally coat the inner surface 31 exposed within the opening 30. The insulating dielectric material 24 can include an inorganic or organic dielectric material or both. In some embodiments, more than one type of insulating dielectric material can be used, such as silicon dioxide and silicon nitride, or a polymer and a nitride. In a particular embodiment, the insulating dielectric layer 24 can include a compliant dielectric material, such that the insulating dielectric material has a sufficiently low modulus of elasticity and sufficient thickness such that the product of the modulus and the thickness provide compliancy.

In the embodiment shown in FIG. 1A, an inward-facing surface of the insulating dielectric layer 24 defines an inner wall 32 of the opening. In embodiments in which the insulating dielectric layer 24 is omitted (e.g., when the substrate 20 consists essentially of a dielectric material), the inner wall 32 of the opening can be coincident with the inner surface 31 of the opening.

In particular embodiments in which the substrate 20 consists essentially of dielectric material (e.g., glass, ceramic, polymer, composite material, or liquid crystal material), the dielectric layers 23a, 23b, and/or 24, or any of the other dielectric layers described herein, may be omitted. The dielectric layers 23a, 23b, and 24 may also be omitted in embodiments in which it is desired that the conductive via 40 is not electrically insulated from the material of the substrate 20, for example, when the conductive via is configured to carry a reference potential. In a particular embodiment, for example, when the conductive via 40 is configured to carry a reference potential, the substrate 20 can consist essentially of a semiconductor material, a surface of the semiconductor material can be exposed at and can define the inner wall 32 of the opening, and a portion of the conductive via 40 can be in contact with the semiconductor material within the opening 30.

The opening 30 can include a conductive via 40 disposed therein and extending from the first surface 21 towards the rear surface 22. In a particular embodiment, first and second conductive vias 40 of a particular component 10 can be connectable to respective first and second electric potentials. In a particular example where a conductive via 40 extends within a substrate 20 that includes a composite material, the substrate can have an effective CTE less than 20 ppm/° C., and the conductive via 40 can extend within a semiconductor region of the substrate. Such a semiconductor region can consist essentially of a material having an effective CTE in a plane of the substrate of no more than 10 ppm/° C.

The conductive via 40 can include a first electrically conductive portion 41 and a second electrically conductive portion 42. The first portion 41 can be exposed at the first surface 21, and the second portion 42 can be exposed at the second surface 22. The first portion 41 can extend partially within the opening 30 at least partially overlying the inner wall 32. The first portion 41 can have a lower surface 43 located between the first and second surfaces 21, 22 of the substrate 20.

The first portion 41 of the conductive via 40 can include a first principal conductor 44 and a first layer structure 50 extending between at least a portion of the first principal conductor and the inner surface 31 of the opening 30. The first principal conductor 44 can include a metal such as copper, aluminum, tungsten, an alloy including copper, an alloy including nickel, or an alloy including tungsten, among others.

The first layer structure 50 can extend between the first principal conductor 44 and the inner wall 32 of the opening (which, in the embodiment of FIG. 1A, is an inward-facing surface of the insulating dielectric layer 24). The first layer structure 50 can extend within the opening 30 from the first surface 21 towards the second surface 22. In some embodiments, the first layer structure 50 can extend between at least part of the first principal conductor 44 and at least part of the second portion 42 of the conductive via 40.

The first layer structure 50 can include one or more of a barrier metal layer, an adhesion layer, and a seed layer. In the example shown in FIG. 1A, the first layer structure 50 can include a barrier layer 51 partially overlying the inner wall 32 of the opening 30, and a seed layer 52 partially overlying the barrier layer 51. The barrier layer 51 can prevent or reduce diffusion of metal from the conductive via 40 into the material of the substrate 20. In one example, the barrier layer 51 can also serve as an adhesion layer, or in some embodiments, the first layer structure 50 can include an adhesion layer (not shown) disposed between the barrier layer 51 and the inner wall 32 of the opening 30.

The barrier layer 51 typically has a thickness of less than 100 nanometers, although the thickness in a particular structure can be greater than or equal to 100 nanometers. The barrier layer 51 can include a material different than the metal or metals of the first and second principal conductors 44, 48 of the conductive via 40. Examples of materials suitable for use in the barrier layer 51 can include nickel, an alloy including nickel, titanium nitride, tantalum nitride, tantalum silicon nitride, tantalum, tungsten silicon nitride, and combinations thereof. The seed layer 52 can be an electrically conductive layer at least partially overlying the barrier layer 51. In one example, the seed layer 52 can include electroless copper and/or another electroless conductor.

The second portion 42 of the conductive via 40 can include a second principal conductor 48 and a second layer structure 60 extending between the first portion 41 of the conductive via and the second principal conductor. The second portion 42 can extend partially within the opening 30 at least partially overlying the inner wall 32. The second principal conductor 48 can include a metal such as copper, aluminum, tungsten, an alloy including copper, an alloy including nickel, or an alloy including tungsten, among others. In the embodiment shown in FIG. 1A, the second layer structure 60 is continuous, such that the second layer structure separates the first portion 41 of the conductive via 40 from the second principal conductor 48 of the second portion 42. In other embodiments, such as that shown in FIG. 1B, the second layer structure 60a may be discontinuous, i.e., having one or more holes or openings extending therethrough. In such an example having a discontinuous second layer structure 60a, the first portion 41 of the conductive via 40 may be at least partially in direct contact with the second principal conductor 48 of the second portion 42.

The second layer structure 60 can extend within the opening 30 from the second surface 22 towards the first surface 21. The second layer structure 60 can include one or more of a barrier metal layer, an adhesion layer, and a seed layer. In the example shown in FIG. 1A, the second layer structure 60 can include a barrier layer 61 at least partially overlying the lower surface 43 of the first portion 41 of the conductive via 40, and a seed layer 62 partially overlying the barrier layer 61.

The barrier layer 61 can prevent or reduce diffusion of metal from the second principal conductor 48 into the material of the substrate 20 or into the first portion 41. In one example, the barrier layer 61 can also serve as an adhesion layer, or in some embodiments, the second layer structure 60 can include an adhesion layer (not shown) disposed between the barrier layer and the lower surface 43 of the first portion 41. In some embodiments, barrier layer 61 can partially overlie the second surface 22 of the substrate 20.

Similar to the barrier layer 51, the barrier layer typically has a thickness of less than 100 nanometers, although the thickness in a particular structure can be greater than or equal to 100 nanometers. The barrier layer 61 can include a metal different than the metal or metals of the first and second principal conductors 44, 48 of the conductive via 40. Examples of metals that can be suitable for use in the barrier layer 61 can include nickel, an alloy including nickel, titanium nitride, tantalum nitride, tantalum silicon nitride, tantalum, tungsten silicon nitride, and combinations thereof. In one embodiment, the barrier layer 61 can be discontinuous, i.e., having one or more holes or openings extending therethrough, so that the seed layer 62 can be formed at least partially in contact with the first principal conductor 44.

The seed layer 62 can be an electrically conductive layer at least partially overlying the barrier layer 61. In some embodiments, the seed layer 62 can partially overlie the second surface 22 of the substrate 20. In one example, the seed layer 62 can include electroless copper.

The conductive via 40 can include one or more outer contact surfaces 4 at the first surface 21 of the substrate 20. In the example shown in FIG. 1A, the contact surface 4 of the conductive via 40 is electrically connected with a BEOL layer 6 configured to provide an electrical connection between the conductive via 40 and a element external to the component 10. The conductive via 40 can include one or more contact portions 5 at the second surface 22 of the substrate 20. Such a contact portion 5 can be integrally formed with the second principal conductor 48 of the conductive via 40, or in some embodiments, the second principal conductor and the contact portion can be formed in separate process steps. The contact portion 5 can be configured for interconnection with an element external to the component 10.

Figure 1B:
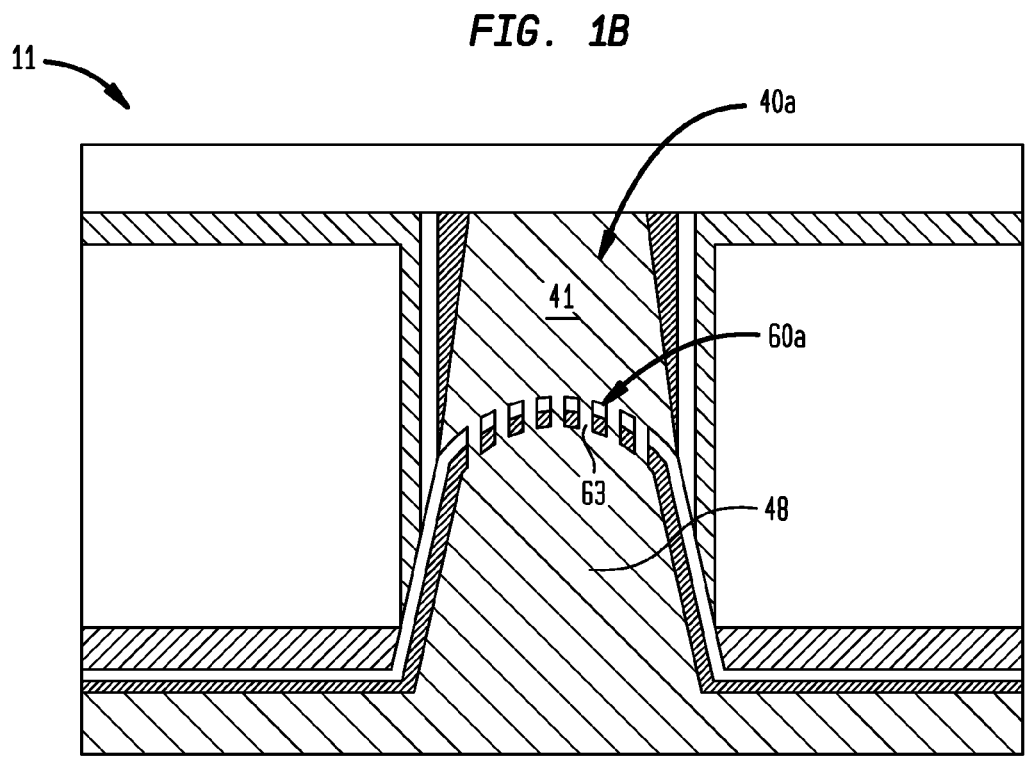
FIG. 1B is a side sectional view illustrating a component in accordance with an alternative embodiment of the conductive via shown in FIG. 1A.

FIG. 1B shows a component 11 that is a variation of the component 10 shown in FIG. 1A. The component 11 is the same as the component 10, except the component 11 includes a second layer structure 60a that is discontinuous, such that the second layer structure has gaps 63 through which the second principal conductor 48 can be formed partially in contact with the first portion 41 of the conductive via 40a.

Figure 2A:
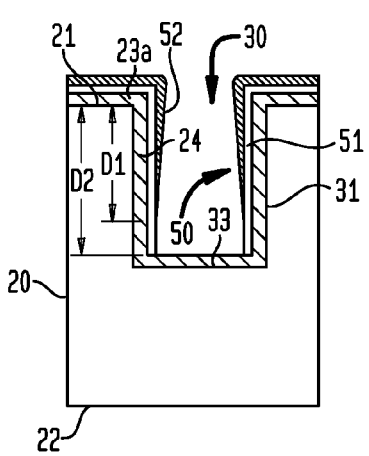
FIGS. 2A-2I are side sectional views illustrating stages of fabrication in accordance with the embodiment depicted in FIG. 1A.

A method of fabricating the component 10 (FIG. 1A) will now be described, with reference to FIGS. 2A-2I. Referring to FIG. 2A, to form one or more openings 30 extending from the first surface 21 towards the second surface 22 of the substrate 20, material can be removed from the first surface of the substrate. The opening 30 can define the inner surface 31 that extends from the first surface 21 through the substrate 20 toward the second surface 22. The inner surface 31 can extend to a bottom surface 33 of the opening 30.

The opening 30 can be formed for example, by selectively etching the substrate 20, after forming a mask layer where it is desired to preserve remaining portions of the first surface 21. For example, a photoimageable layer, e.g., a photoresist layer, can be deposited and patterned to cover only portions of the first surface 21, after which a timed etch process can be conducted to form the opening 30.

The inner surfaces 31 of the opening 30, extending downwardly from the first surface 21 towards the second surface 22, may be sloped, i.e., may extend at angles other a normal angle (right angle) to the first surface. Wet etching processes, e.g., isotropic etching processes and sawing using a tapered blade, among others, can be used to form an opening 30 having sloped inner surfaces 31. Laser dicing, mechanical milling, among others, can also be used to form an opening 30 having sloped inner surfaces 31.

Alternatively, instead of being sloped, the inner surface 31 of each opening 30 may extend in a vertical or substantially vertical direction downwardly from the first surface 21 substantially at right angles to the first surface (as shown in FIG. 1A). Anisotropic etching processes, laser dicing, laser drilling, mechanical removal processes, e.g., sawing, milling, ultrasonic machining, among others, can be used to form openings 30 having essentially vertical inner surfaces 31.

In a particular embodiment, the opening 30 can be formed, for example, by first using an anisotropic etch process such as a fast DRIE etch or a reactive ion etch to produce an initial opening having a relatively rough initial inner surface, and then using a chemical etch or electropolishing to remove the roughness or scallops extending along the initial inner surface. In one example, the opening can be formed, for example, by isotropic etching of the substrate followed by anisotropic etching of the substrate.

A portion of a passivation layer overlying the first surface 21 of the substrate 20 can also removed during the formation of the opening 30, and such portion can be etched through during the etching of the substrate, or as a separate etching step. Etching, laser drilling, mechanical milling, or other appropriate techniques can be used to remove the portion of such a passivation layer.

After formation of the opening 30, the insulating dielectric layer 23a shown in FIG. 1A can be deposited overlying or coating the first surface 21 of the substrate 20, and the dielectric layer 24 shown in FIG. 1A can be deposited overlying or coating the inner surface 31 and the bottom surface 33 of one or more of the openings 30. As described above, the dielectric layers 23a and 24 can be deposited in a single process.

In a particular embodiment, a mask can be applied to portions of the first surface 21 of the substrate 20 having openings 30 in which it is desired not to form the insulating dielectric layer 24. Such uncoated ones of the openings 30 can be later filled with conductive vias 40 that have portions directly contacting material of the substrate 20. Such a conductive via 40 can be electrically coupled to a ground electric potential. In a particular embodiment in which the substrate consists essentially of dielectric material (e.g., glass or ceramic), the dielectric layers 23a and/or 24, or any of the other dielectric layers described herein, may be partially or entirely omitted. In such embodiments having one or more openings 30 without dielectric layers 23a and/or 24, the inner wall 32 of such an opening 30 can be coincident with the inner surface 31 of the opening.

Various methods can be used to form such insulating dielectric layers 23a and 24 overlying the first surface 21 and the surfaces 31, 33 of the openings 30, respectively, and such methods are described below. In particular examples, chemical vapor deposition (CVD) or atomic layer deposition (ALD) can be used to deposit a thin insulating dielectric layer overlying the first surface 21 and/or surfaces 31, 33 of the openings 30. In one example, tetraethylorthosilicate (TEOS) can be used during a low-temperature process for depositing such an insulating dielectric layer. In exemplary embodiments, a layer of silicon dioxide, borophosphosilicate glass (BPSG), borosilicate glass (BSG), or phosphosilicate glass (PSG) can be deposited overlying the surfaces 31, 33 of the openings 30, and such glass can be doped or undoped. Other processes can be used to form such insulating dielectric layers 23a and 24, such as those described in U.S. Patent Application Publication No. 2012/0018868, the disclosure of which is hereby incorporated by reference herein.

Still referring to FIG. 2A, the first layer structure 50 can then be formed overlying at least part of the inner surface 31 of the opening 30 (and the insulating dielectric layers 23a and 24 if they are present). The first layer structure 50 may also be formed overlying at least part of the bottom surface 33 of the opening. As can be seen in FIG. 2A, the first layer structure 50 may have poor barrier and/or seed coverage of the bottom surface 33 and on those portions of the inner surface 31 near the bottom surface. For example, the barrier layer 51 may only overlie part of the inner surface 31 and/or the bottom surface 33. In a particular embodiment, the barrier layer 51 may overlie the entire inner surface 31 but only part of the bottom surface 33, such that the barrier defines a gap therein exposing the part of the dielectric layer 24 or the bottom surface therein.

The seed layer 52 may also only overlie part of the inner surface 31 and/or the bottom surface 33. As shown in FIG. 2A, the seed layer 52 can overlie the inner surface 31 up to a first depth D1 from the first surface 21, the first depth D1 being less than a distance D2 from the first surface to the exposed portion of the dielectric layer 24 or barrier layer 51 overlying the bottom surface 33. In one example, the seed layer 52 may overlie the entire inner surface 31 and the entire bottom surface 33, but the seed layer may only marginally cover parts of the inner surface and the bottom surface, such that the seed layer may be considered to be defective. In a particular embodiment, the seed layer 52 may overlie the entire inner surface 31 but only part of the bottom surface 33, such that the seed layer defines a gap therein exposing the part of the dielectric layer 24 or the bottom surface therein.

For example, the first layer structure 50 or portions of the first layer structure (e.g., an adhesion layer, the barrier layer 51, and/or the seed layer 52) can be formed using atomic layer deposition (ALD), physical vapor deposition (PVD), or electroless or electrolytic deposition methods.

Figure 2B:
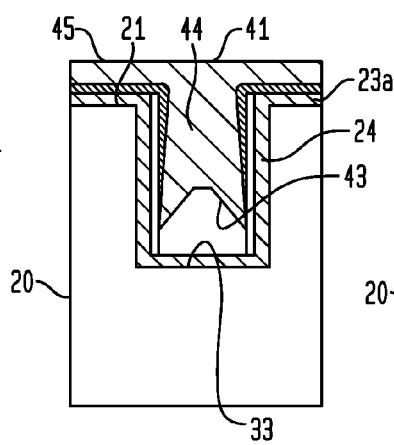

Then, as shown in FIG. 2B, the first principal conductor 44 of the conductive via 40 can be formed at least partially overlying and electrically coupled to the first layer structure 50. At least part of the lower surface 43 of the first principal conductor 44 is spaced apart from the bottom surface 33 of the opening 30. As shown, material of the first layer structure 50 and the first principal conductor 44 of the conductive via 40 can be deposited onto portions of the first surface 21 that are outside of the opening 30.

To form any one of the first layer structure 50 and the first principal conductor 44 of the conductive via 40, an exemplary method involves depositing a metal layer by one or more of sputtering a primary metal layer onto exposed surfaces of the insulating dielectric layers 23a and/or 24, plating, or mechanical deposition. Mechanical deposition can involve the directing a stream of heated metal particles at high speed onto the surface to be coated. In other embodiments, sub-micron metal powder can be screened or selectively screened into the cavities, for example, using a pulse laser, and the metal flow will fill the cavities. This step can be performed by blanket deposition onto the insulating dielectric layers 23a and/or 24, for example.

Figure 2C:
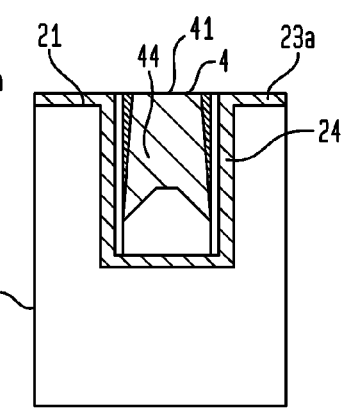

An initial exposed surface 45 (FIG. 2B) of the first principal conductor 44 of the conductive via 40, as well as portions of the first layer structure 50 that extend above the dielectric layer 23a, can be planarized so that the resulting contact surface 4 of the first portion is closer to the first surface 21 of the substrate 20, as shown in FIG. 2C. This operation can be performed by various exemplary methods. In one embodiment, a grinding process can be used, for example, to planarize the initial exposed surface 45. The grinding process can remove both a portion of the material of the first principal conductor 44 of the conductive via 40 and a portion of the first layer structure 50 above the first surface 21 of the substrate 20. The initial exposed surface 45 can also be planarized by lapping, polishing, or by high-precision milling.

In a particular example, chemical mechanical polishing ("CMP") can be used to planarize the initial exposed surface 45 of the conductive via 40. An exemplary CMP process can include sanding the initial exposed surface 45 with an abrasive pad, using a slurry. Such a slurry can typically include an oxidizing agent and a passivation agent. An exemplary CMP process can include using an abrasive slurry, including, for example, a micro-silica paste, to planarize the initial exposed surface 45.

Figure 2D:
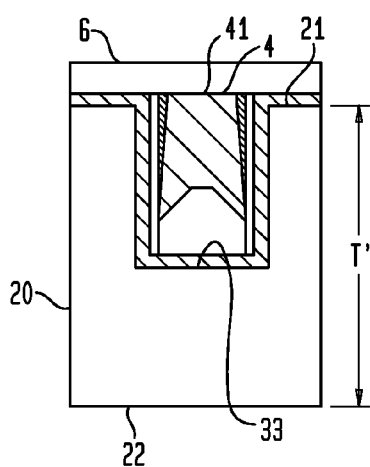

Referring now to FIG. 2D, a back-end-of-line ("BEOL") layer 6 can be formed overlying the contact surface 4 of the first portion 41 of the conductive via 40 at the first surface 21 of the substrate 20. Such a BEOL layer can include one or more dielectric and conductor layers. As described above, the BEOL layer 6 can be configured to provide an electrical connection between the first portion 41 of the conductive via 40 and another element within the component 10 or external to the component.

Figure 2E:
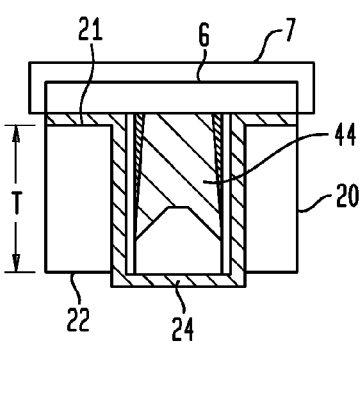

As shown in FIG. 2E, a support wafer 7 can be attached to the BEOL layer 6 to provide support for the first surface 21 of the substrate 20 during fabrication processes applied to the second surface 22. Then, material of the substrate 20 can be removed from the second surface 22, using one or more of the material removal processes described above, for example, processes such as grinding, etching, and/or a CMP process. In one example, the step of removing material of the substrate 20 from the second surface 22 can include removing a planar portion of the substrate from the second surface, such that the thickness of the substrate between the first and second surfaces 21, 22 is reduced from an initial thickness T' (FIG. 2D) to a final thickness T (FIG. 2E). Material of the substrate 20 can be removed from the second surface 22 until a portion of the dielectric layer 24 is exposed at the second surface. As can be seen in FIG. 2E, the portion of the dielectric layer 24 overlying the bottom surface 33 (FIG. 2D) of the opening 31 can remain intact and exposed at the second surface 22 of the substrate 20, to prevent contamination of the material of the first principal conductor 44 by material of the substrate during the process of removal of material of the substrate.

Figure 2F:
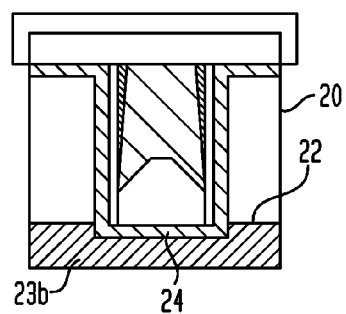

Referring to FIG. 2F, the dielectric layer 23b can be formed overlying exposed portions of the second surface 22 and exposed portions of the dielectric layer 24. The dielectric layer 23b can be formed using one or more of the processes described above with reference to formation of the dielectric layers 23a and 24.

Figure 2G:
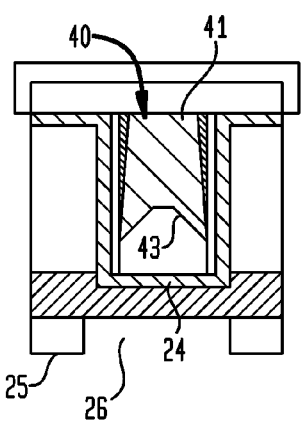

Referring now to FIG. 2G, a mask layer 25 can be formed overlying portions of the second surface 22 of the substrate 20. The mask layer 25 can have gaps 26 at the areas of the dielectric layer 23b where it is desired to expose the lower surface 43 of the first portion 41 of the conductive via 40. For example, a photoimageable layer, e.g., a photoresist layer, can be deposited and patterned to cover portions of the dielectric layer 23b.

Figure 2H:
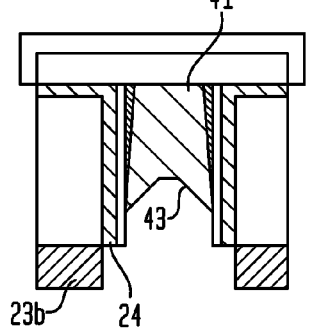

As shown in FIG. 2H, material of the dielectric layers 23b and 24 can be removed at the gaps 26 within the mask layer 25, thereby exposing the lower portion 43 of the first portion 41 of the conductive via 40 at the second surface 22. Portions of the dielectric layers 23b and 24 can be removed, for example, using an etching process or one or more of the other material removal processes described above with reference to forming the opening 30. After the lower portion 43 of the first portion 41 of the conductive via 40 is exposed at the second surface 22, the mask layer 25 can be removed from the second surface.

Figure 2I:
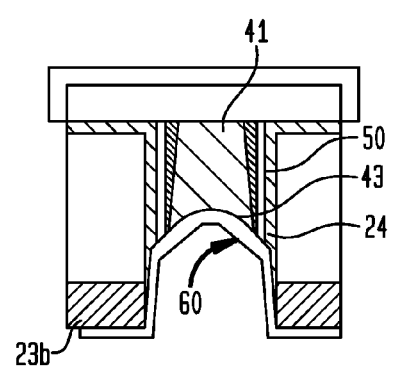

Then, as shown in FIG. 2I, the exposed lower portion 43 of the first portion 41 of the conductive via 40 and the exposed surfaces of the dielectric layer 24, and the dielectric layer 23b can be coated by the second layer structure 60, which may include one or more of an adhesion layer, the barrier layer 61, and the seed layer 62 described above. The second layer structure 60 can be deposited via any of the metal deposition processes described above with reference to the first principal conductor 44 of the conductive via 40 or the first layer structure 50.

Next, referring again to FIG. 1A, the second principal conductor 48 of the second portion 42 of the conductive via 40 can be formed within the opening 30 and overlying the second layer structure 60. The second principal conductor 48 can have a contact portion 5 at the second surface 22 for interconnection with an element external to the component 10. The contact portion 5 may be located above the second surface 22, coplanar with the second surface, or recessed below the second surface.

Such a process as described above, in which first and second portions 41, 42 of a conductive via 40 are formed from opposite sides of a substrate 20, can be used to reliably form high aspect ratio conductive vias 40 using equipment that can only reliably produce conductive vias having a limited depth below a surface of the substrate. Such a process may allow the use of lower-cost limited-depth conductive via forming equipment to produce high aspect ratio vias, rather than requiring the use of higher-cost equipment that can form high aspect ratio vias from a single side of the substrate. In a particular example, equipment that can form conductive vias having an aspect ratio of up to 10 from one side of a substrate can be used in a process as described above to form conductive vias from both sides of the substrate having an aspect ratio of up to 20.

Referring now to FIGS. 3A-3C, in one alternative method of forming a component 10a, conductive traces may be formed in a single process with the second principal conductor 48 of the second portion 42 of the conductive via 40. Such a method can begin with the process steps shown and described with reference to FIGS. 2A-2F.

Then, as shown in FIG. 3A, a mask layer 25a can be formed overlying portions of the second surface 22 of the substrate 20. The mask layer 25a can have gaps 26a at the areas of the dielectric layer 23b where it is desired to expose the lower surface 43 of the first portion 41 of the conductive via 40, and the mask layer can have gaps 26b at the areas of the dielectric layer 23b where it is desired to form traces extending along the second surface 22.

As shown in FIG. 3B, material of the dielectric layers 23b and 24 can be removed at the gaps 26a and 26b within the mask layer 25a, thereby exposing the lower portion of the first portion 41 of the conductive via 40 and forming channels 26c within the dielectric layer 23b. After the lower portion 43 of the first portion 41 of the conductive via 40 is exposed at the second surface 22 and the channels 26c are formed within the dielectric layer 23b, the mask layer 25a can be removed from the second surface.

Then, as shown in FIG. 3C, the exposed lower portion 43 of the first portion 41 of the conductive via 40 and the exposed surfaces of the dielectric layer 24, and the dielectric layer 23b can be coated by the second layer structure 60. Next, the second principal conductor 48 of the second portion 42 of the conductive via 40 can be formed within the opening 30 and overlying the second layer structure 60, and traces 46 and other conductive structure can be formed within the channels 26c of the dielectric layer 23b in a single process along with the second principal conductor 48.

Referring now to FIGS. 4A-4F, in another alternative method of forming a component 10b, the second principal conductor 48 of the second portion 42 of a conductive via 40b may be exposed at a surface of a second substrate 20b attached to a first substrate 20a. Such a method can begin with the process steps shown and described with reference to FIGS. 2A-2F.

Then, as shown in FIG. 4A, a second substrate 20b having opposed first and second surfaces 21b, 22b can be joined with the first substrate 20a overlying the dielectric layer 23b. The first and second substrates 20a, 20b can be joined such that the second surface 22a of the first substrate faces the second surface 22b of the second substrate. The second substrate 20b can have an opening 30b extending through a thickness thereof, the opening 30b being partially or fully aligned with the opening 30a of the first substrate 20a.

Next, referring to FIG. 4B, a mask layer 25b can be formed overlying portions of the first surface 21b of the second substrate 20b. The mask layer 25b can have gaps 26 at the areas of the dielectric layer 23b where it is desired to expose the lower surface 43 of the first portion 41 of the conductive via 40b.

As shown in FIG. 4C, material of the dielectric layers 23b and 24 can be removed at the gaps 26 within the mask layer 25b, thereby exposing the lower portion 43 of the first portion 41 of the conductive via 40b at the first surface 21b of the second substrate 20b. After the lower portion 43 of the first portion 41 of the conductive via 40b is exposed at the first surface 21b of the second substrate 20b, the mask layer 25b can be removed from the first surface of the second substrate.

Then, as shown in FIG. 4D, the exposed lower portion 43 of the first portion 41 of the conductive via 40b and the exposed surfaces of the dielectric layer 24, the dielectric layer 23b, and the first surface 21b of the second substrate 20b can be coated by the second layer structure 60. In embodiments having a second substrate 20b comprising semiconductor material, the second layer structure 60 can also overlie a passivation layer at the first surface 21b of the second substrate 20b. A mask layer 25c, shown in dashed lines, can then be formed overlying portions of the first surface 21b of the second substrate 20b where it is not desired to deposit the second principal conductor 48 and/or traces 46 and other conductive structure at the first surface 21b of the second substrate 20b.

Next, referring to FIG. 4E, the second principal conductor 48 of the second portion 42 of the conductive via 40b can be formed within the opening 30 and overlying the second layer structure 60. The second principal conductor 48 can be exposed at the first surface 21b of the second substrate 20b. The contact portion 5 of the second principal conductor 48 can at least partially overlie the first surface 21b of the second substrate 20b. Traces 46 and other conductive structure can be formed at the first surface 21b of the second substrate 20b in a single process along with the second principal conductor 48. The mask layer 25c can then be removed. A mask layer 25d can then be formed overlying portions of the first surface 21b of the second substrate 20b where it is desired to retain portions of the traces 46 and other conductive structure at the first surface 21b of the second substrate.

Referring to FIG. 4F, traces 46 and other conductive structure exposed within gaps between portions of the mask layer 25d can be removed via etching or any of the other material removal processes described above. Then, the mask layer 25d can be removed from the first surface 21b of the second substrate 20b.

Referring now to FIGS. 5A-5D, in an alternative method of forming a component 10c having first and second substrates 20a and 20b, the second principal conductor 48 of the second portion 42 of a conductive via 40c can have a recess 47 therein at the first surface 21b of the second substrate. Such a method can begin with the process steps shown and described with reference to FIGS. 2A-2F and 4A-4D.

Referring to FIG. 5A, a mask layer 25c can be formed overlying portions of the first surface 21b of the second substrate 20b where it is not desired to deposit the second principal conductor 48 and/or traces 46 and other conductive structure at the first surface 21b of the second substrate 20b.

Next, referring to FIG. 5B, the second principal conductor 48 of the second portion 42 of the conductive via 40c can be formed within the opening 30 and overlying the second layer structure 60. The second principal conductor 48 can be exposed at the first surface 21b of the second substrate 20b. Traces 46 and other conductive structure can be formed at the first surface 21b of the second substrate 20b in a single process along with the second principal conductor 48. The second principal conductor 48 can conform to a contour of at least one of: the lower surface 43 of the first portion 41 of the conductive via 40c; and material of the second substrate 20b exposed within the opening 30b.

Then, referring to FIG. 5C, the mask layer 25c can be removed, leaving contact portions 5 of the second principal conductor 48 at the first surface 21b of the second substrate 20b and traces 46 and other conductive structure at the first surface 21b of the second substrate 20b.

Referring to FIG. 5D, joining units 11 can be formed at the contact portions 5 of the second principal conductor 48, and at contact portions of the other conductive structure at the first surface 21b of the second substrate 20b. The joining units 11 can be configured for connection with an element external to the component 10c. The joining units 11 can be, for example, masses of a bond metal such as solder, tin, indium, a eutectic composition or combination thereof, or another joining material such as a conductive paste or a conductive adhesive. In a particular embodiment, the joints between the contact portions 5 and contacts of an external component (e.g., the circuit panel 602 shown in FIG. 9) can include an electrically conductive matrix material such as described in commonly owned U.S. patent application Ser. Nos. 13/155,719 and 13/158,797, the disclosures of which are hereby incorporated herein by reference. In a particular embodiment, the joints can have a similar structure or be formed in a manner as described therein.

Referring to FIG. 5E, instead of or in addition to forming joining units 11 at the contact portions 5 of the second principal conductor 48, a joining unit 11a can be formed extending into the recess 47 within the second principal conductor 48. In such an embodiment, the material of the second principal conductor 48 can be protected from diffusion of the material of the joining unit 11 by a barrier layer 49 overlying an exposed surface of the second principal conductor at least within the recess 47. Such a barrier layer can have a similar thickness as described above with reference to the barrier layer 51 and can be made of a material such as those described above with reference to the barrier layer 51.

As illustrated in FIG. 6A, a component 110 can include a substrate 120 having a first surface 121 and a second surface 122 opposite therefrom, and a conductive via 140 disposed within an opening 130 extending from the first surface towards the second surface. The component 110 can be the same as the component 10 shown and described above with respect to FIG. 1A, but rather than having two principal conductors at least partially separated by a second layer structure, the component 110 has a single principal conductor 144 exposed at the first and second surfaces 121, 122 of the substrate 120. The component 110 can have a first layer structure 150 extending within the opening 130 at least partially along the inner wall 132, and a second layer structure 160 contacting the first layer structure and extending within the opening at least partially along the inner wall.

FIG. 6B shows a component 110a that is a variation of the component 110 shown in FIG. 6A. The component 110a is the same as the component 110, except that the principal conductor 144a conforms to a contour of the first and second layer structures 150 and 160 within the opening 130, and the principal conductor defines an aperture 147 extending therethrough between the first and second surfaces of the substrate. The component 110a can include a barrier layer 149 overlying an exposed surface 145 within the aperture 147. Such a barrier layer 149 can have a similar thickness as described above with reference to the barrier layer 51 and can be made of a material such as those described above with reference to the barrier layer 51. In one example, the component 110a can also include a dielectric region (not shown) disposed within the aperture 147 and overlying at least a portion of the barrier layer 149.

Figure 7A:
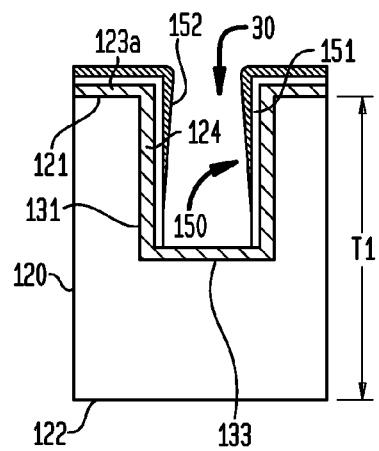
FIGS. 7A-7F are side sectional views illustrating stages of fabrication in accordance with either of the embodiments depicted in FIG. 6A or 6B.

A method of fabricating either the component 110 (FIG. 6A) or the component 110a (FIG. 6B) will now be described, with reference to FIGS. 7A-7F. Referring to FIG. 7A, material can be removed from the first surface 121 of the substrate 120 to form one or more openings 130 extending from the first surface 121 towards the second surface 122 of the substrate 120. Also similar to FIG. 2A, dielectric layers 123a and 124 can be deposited overlying the first surface 121 of the substrate 120 and the inner surface 131 and the bottom surface 133 of the openings 130. The first layer structure 150 can then be formed overlying at least part of the inner surface 131 of the opening 130 (and the insulating dielectric layers 123a and 124 if they are present). Similar to FIG. 2A, the first layer structure 150 can include one or more of an adhesion layer, a barrier layer 151, and a seed layer 152 overlying at least a portion of the inner surface 131. The openings 130, the dielectric layers 123a and 124, and the first layer structure 150 can each be formed using any one of or a combination of the processes described above with reference to FIG. 2A.

Figure 7B:
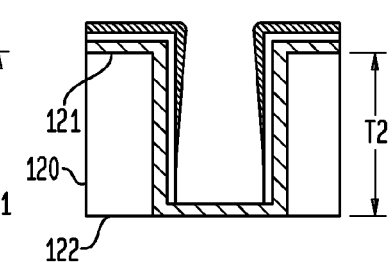

As shown in FIG. 7B, material of the substrate 120 can be removed from the second surface 122, using one or more of the material removal processes described above, for example, processes such as grinding, etching, and/or a CMP process. The thickness of the substrate 120 between the first and second surfaces 121, 122 can be reduced from an initial thickness T1 (FIG. 7A) to a final thickness T2 (FIG. 7B).

Figure 7C:
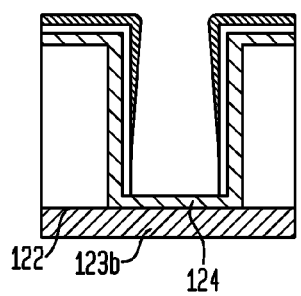

Referring to FIG. 7C, the dielectric layer 123b can be formed overlying exposed portions of the second surface 122 and exposed portions of the dielectric layer 124. The dielectric layer 123b can be formed using one or more of the processes described above with reference to formation of the dielectric layers 23a and 24.

Figure 7D:
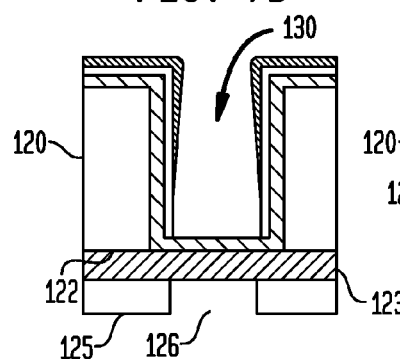

Then, as shown in FIG. 7D, a mask layer 125 can be formed overlying portions of the second surface 122 of the substrate 120. The mask layer 125 can have gaps 126 at the areas of the dielectric layer 123b where it is desired to expose the openings 130.

Figure 7E:
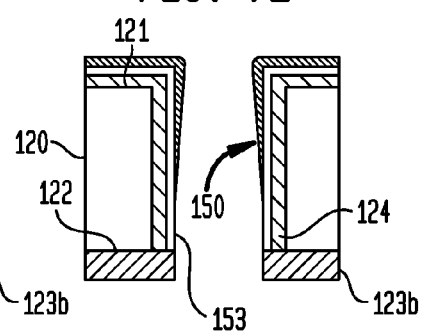

As shown in FIG. 7E, material of the dielectric layers 123b and 124 can be removed at the gaps 126 within the mask layer 125, thereby exposing a lower edge 153 of the first layer structure 150 at the second surface 122. The lower edge 153 can be located between the first and second surfaces 121, 122 of the substrate 120. After the opening 130 is exposed at the second surface 122, the mask layer 125 can be removed from the second surface.

Figure 7F:
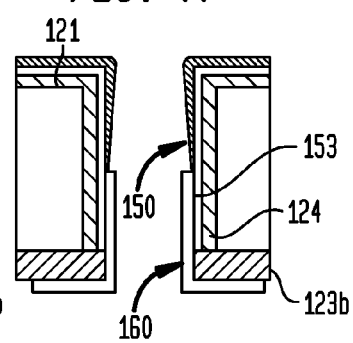

Next, as shown in FIG. 7F, at least a portion of the first layer structure 150 and the exposed surfaces of the dielectric layer 124 and the dielectric layer 123b can be coated by the second layer structure 160, which may include one or more of an adhesion layer, a barrier layer, and a seed layer, as described above. The second layer structure 160 can be deposited via any of the metal deposition processes described above.

Subsequently, if it is desired to form the component 110 shown in FIG. 6A, the principal conductor 144 can be formed within the opening 130 and overlying the first and second layer structures 150, 160. The principal conductor 144 can have outer contact surfaces 104 at one or both of the first and second surfaces 121, 122 of the substrate 120. Each outer contact surface 104 may be located above, coplanar with, or recessed below the corresponding first or second surface 121 or 122.

Alternatively, if it is desired to form the component 110a shown in FIG. 6B, the principal conductor 144a can be formed within the opening 130 and overlying the first and second layer structures 150, 160, such that the principal conductor conforms to a contour of the first and second layer structures within the opening 130. The principal conductor 144a can be deposited conformally, such that the principal conductor defines an aperture 147 extending therethrough between the first and second surfaces 121, 122 of the substrate 120. The barrier layer 149 can then be formed overlying an exposed surface 145 within the aperture 147. Finally, if desired, a dielectric region (not shown) can be formed within the aperture 147 and overlying at least a portion of the barrier layer 149.

Figure 8:
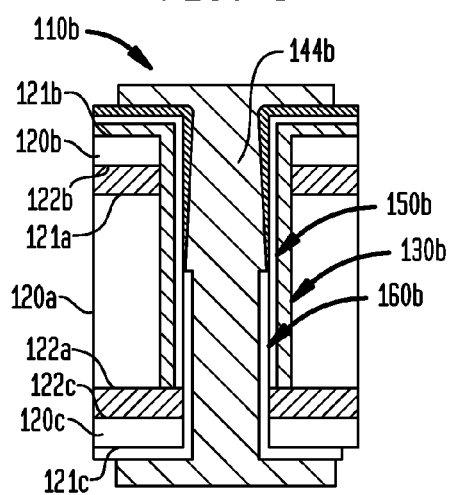
FIG. 8 is a side sectional view illustrating a component in accordance with an alternative embodiment of the conductive via shown in FIG. 6A.

FIG. 8 shows a component 110b that is a variation of the component 110 shown in FIG. 6A. The component 110b is the same as the component 110, except that the principal conductor 144b extends through an opening 130b extending through a first substrate 120a, as well as second and third substrates 120b and 120c that are attached to the respective first and second surfaces 121a and 122a of the substrate 120a. The component 110b can be formed by attaching the second and third substrates 120b and 120c to the first substrate 120a in a manner similar to that described above with reference to FIG. 4A. In one example, one of the second or third substrates 120b or 120c can be omitted if a structure having only two substrates with a single principal conductor 144b extending therethrough is desired.

Figure 9:
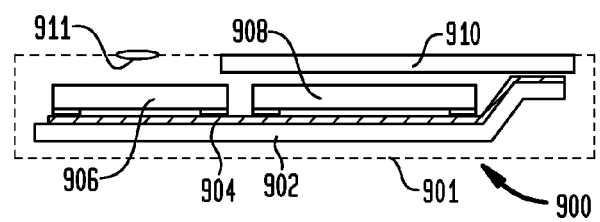
FIG. 9 is a schematic depiction of a system according to one embodiment of the invention.

The microelectronic packages and microelectronic assemblies described above with reference to FIG. 1A through can be utilized in construction of diverse electronic systems, such as the system 900 shown in FIG. 9. For example, the system 900 in accordance with a further embodiment of the invention includes one or more modules or components 906 such as the components 10, 10a, 10b, and 10c described above in conjunction with other electronic components 908 and 910.

In the exemplary system 900 shown, the system can include a circuit panel, motherboard, or riser panel 902 such as a flexible printed circuit board, and the circuit panel can include numerous conductors 904, of which only one is depicted in FIG. 9, interconnecting the modules or components 906 with one another. Such a circuit panel 902 can transport signals to and from each of the microelectronic packages and/or microelectronic assemblies included in the system 900. However, this is merely exemplary; any suitable structure for making electrical connections between the modules or components 906 can be used.

In a particular embodiment, the system 900 can also include a processor such as the semiconductor chip 908, such that each module or component 906 can be configured to transfer a number N of data bits in parallel in a clock cycle, and the processor can be configured to transfer a number M of data bits in parallel in a clock cycle, M being greater than or equal to N.

In the example depicted in FIG. 9, the component 908 is a semiconductor chip and component 910 is a display screen, but any other components can be used in the system 900. Of course, although only two additional components 908 and 910 are depicted in FIG. 9 for clarity of illustration, the system 900 can include any number of such components.

Modules or components 906 and components 908 and 910 can be mounted in a common housing 901, schematically depicted in broken lines, and can be electrically interconnected with one another as necessary to form the desired circuit. The housing 901 is depicted as a portable housing of the type usable, for example, in a cellular telephone or personal digital assistant, and screen 910 can be exposed at the surface of the housing. In embodiments where a structure 906 includes a light-sensitive element such as an imaging chip, a lens 911 or other optical device also can be provided for routing light to the structure. Again, the simplified system shown in FIG. 9 is merely exemplary; other systems, including systems commonly regarded as fixed structures, such as desktop computers, routers and the like can be made using the structures discussed above.

Although a silicon substrate having active device regions therein is only described with reference to the embodiment shown in FIG. 1A, the substrate of any of the components described herein can be made of silicon or a dielectric material such as glass, ceramic, a composite material, or symmetric or asymmetric laminates, as described above. When the substrate is made of silicon, any such substrate in any of the embodiments described herein can include active semiconductor devices in one or more active device regions of the substrate.

The openings, apertures, and conductive elements disclosed herein can be formed by processes such as those disclosed in greater detail in United States Patent Application Publication Nos. 2008/0246136, 2012/0018863, 2012/0018868, 2012/0018893, 2012/0018894, 2012/0018895, and 2012/0020026, the disclosures of which are hereby incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A method of fabricating a component, comprising:
   forming a first layer structure being electrically conductive and extending within an opening in a substrate, the opening extending from a first surface of the substrate towards a second surface opposite from the first surface, the opening having an inner wall extending away from the first surface and a bottom remote from the first surface, a dielectric material being exposed at the inner wall, the first layer structure extending at least partially along the inner wall, the first layer structure contacting the dielectric material exposed at the inner wall, the first layer structure having a lower edge located between the first and second surfaces of the substrate;
   exposing the opening at the second surface of the substrate by processing applied to the substrate from above the second surface;
   forming a second layer structure in contact with the lower edge of the first layer structure and in contact with a portion of the dielectric material exposed at the inner wall, the second layer structure being electrically conductive and extending at least partially along the inner wall; and
   forming a principal conductor at least partially overlying the first layer structure and the second layer structure, the principal conductor being exposed at the first and second surfaces of the substrate.

2. The method as claimed in claim 1, wherein the principal conductor is formed conforming to a contour of the first and second layer structures within the opening, the principal conductor defining an aperture extending therethrough between the first and second surfaces of the substrate.

3. The method as claimed in claim 2, further comprising forming a barrier layer overlying an exposed surface of the aperture.

4. The method as claimed in claim 1, further comprising, before the step of forming the first layer structure, forming the opening extending from the first surface of the substrate towards the second surface.

5. The method as claimed in claim 1, wherein the substrate consists essentially of the dielectric material.

6. The method as claimed in claim 1, wherein the substrate consists essentially of a semiconductor material, and wherein the dielectric material is a dielectric layer that overlies the semiconductor material within the opening, the dielectric layer defining the inner wall of the opening.

7. A method of fabricating a component, comprising:
   forming a first layer structure extending within an opening in a substrate, the opening extending from a first surface of the substrate towards a second surface opposite from the first surface, the opening having an inner wall extending away from the first surface and a bottom remote from the first surface, the first layer structure extending at least partially along the inner wall;
   exposing the opening at the second surface of the substrate by processing applied to the substrate from above the second surface;
   forming a second layer structure in contact with the first layer structure, the second layer structure extending at least partially along the inner wall;
   forming a principal conductor at least partially overlying the first layer structure and the second layer structure, the principal conductor being exposed at the first and second surfaces of the substrate, the principal conductor being formed conforming to a contour of the first and second layer structures within the opening, the principal conductor defining an aperture extending therethrough between the first and second surfaces of the substrate;
   forming a barrier layer overlying an exposed surface of the aperture; and
   forming a dielectric region within the aperture overlying the barrier layer.

* * * * *